United States Patent
Habermehl

(10) Patent No.: US 9,546,420 B1
(45) Date of Patent: Jan. 17, 2017

(54) METHODS OF DEPOSITING AN ALPHA-SILICON-CARBIDE-CONTAINING FILM AT LOW TEMPERATURE

(71) Applicant: Sandia Corporation, Albuquerque, NM (US)

(72) Inventor: Scott D. Habermehl, Corrales, NM (US)

(73) Assignee: Sandia Corporation, Albuquerque, NM (US)

( * ) Notice: Subject to any disclaimer, the term of this patent is extended or adjusted under 35 U.S.C. 154(b) by 168 days.

(21) Appl. No.: 14/452,322

(22) Filed: Aug. 5, 2014

Related U.S. Application Data

(62) Division of application No. 13/646,801, filed on Oct. 8, 2012, now abandoned.

(51) Int. Cl.
| | |
|---|---|
| C23C 16/32 | (2006.01) |
| C30B 25/16 | (2006.01) |
| C30B 29/36 | (2006.01) |
| H01L 21/02 | (2006.01) |

(52) U.S. Cl.
CPC ............ *C23C 16/325* (2013.01); *C30B 25/165* (2013.01); *C30B 29/36* (2013.01); *H01L 21/0262* (2013.01); *H01L 21/02529* (2013.01)

(58) Field of Classification Search
CPC .................... C23C 16/32; C23C 16/325
See application file for complete search history.

(56) References Cited

U.S. PATENT DOCUMENTS

| | | | | |
|---|---|---|---|---|
| 4,194,028 | A | * | 3/1980 | Sirtl .................... B01L 3/04 422/908 |
| 5,087,434 | A | * | 2/1992 | Frenklach .............. C01B 31/06 423/446 |
| 5,254,370 | A | * | 10/1993 | Nagasawa ............... C23C 16/48 427/249.15 |
| 5,296,258 | A | * | 3/1994 | Tay ....................... C23C 16/325 427/249.15 |
| 5,471,946 | A | * | 12/1995 | Scholz ................... C30B 25/02 117/84 |
| 5,698,261 | A | * | 12/1997 | Ivanov .................. C23C 16/325 427/249.15 |

(Continued)

FOREIGN PATENT DOCUMENTS

| | | | |
|---|---|---|---|
| JP | 61-295372 | * | 12/1986 |
| JP | 1-162326 | * | 6/1989 |

OTHER PUBLICATIONS

Stoldt, C.R., et al., "Micromechanical properties of silicon-carbide thin films using single-source chemical-vapor deposition". Applied Physics Letters, vol. 79, No. 3, Jul. 16, 2001, pp. 347-349.*

(Continued)

*Primary Examiner* — Bret Chen
(74) *Attorney, Agent, or Firm* — Martin I. Finston; Helen S. Baca

(57) ABSTRACT

Described methods are useful for depositing a silicon carbide film including Alpha-SiC at low temperatures (e.g., below about 1400° C.), and resulting multi-layer structures and devices. A method includes introducing a chlorinated hydrocarbon gas and a chlorosilicon gas into a reaction chamber, and reacting the chlorinated hydrocarbon gas with the chlorosilicon gas at a temperature of less than about 1400° C. to grow the silicon carbide film. The silicon carbide film so-formed includes Alpha-SiC.

18 Claims, 6 Drawing Sheets

(56) References Cited

U.S. PATENT DOCUMENTS

| | | | | |
|---|---|---|---|---|
| 6,354,832 | B1* | 3/2002 | Yoshimura | H01L 21/67109 118/725 |
| 7,407,858 | B2 | 8/2008 | Li et al. | |
| 7,914,963 | B2* | 3/2011 | Fields | G03G 9/08722 430/108.8 |
| 2002/0102358 | A1* | 8/2002 | Das | H01L 21/049 427/376.2 |
| 2004/0241343 | A1* | 12/2004 | Nishino | C30B 23/02 427/589 |
| 2005/0106320 | A1* | 5/2005 | Mehregany | C23C 16/325 427/249.15 |
| 2005/0193800 | A1* | 9/2005 | DeBoer | G01N 27/128 73/1.06 |
| 2006/0024969 | A1* | 2/2006 | Shive | C04B 41/009 438/706 |
| 2006/0289873 | A1* | 12/2006 | Rowland | H01L 21/02447 257/77 |
| 2009/0220801 | A1 | 9/2009 | Wagner et al. | |
| 2009/0263306 | A1* | 10/2009 | Ohmi | C23C 16/01 423/345 |
| 2009/0314432 | A1* | 12/2009 | Iizuka | H01J 37/3244 156/345.27 |
| 2010/0330266 | A1* | 12/2010 | Yata | C23C 14/086 427/74 |
| 2011/0226182 | A1* | 9/2011 | Sasaki | C30B 23/00 118/726 |
| 2012/0088088 | A1* | 4/2012 | Garnier | B82Y 30/00 428/292.1 |
| 2013/0309496 | A1* | 11/2013 | Zwieback | C30B 28/12 428/402 |
| 2015/0151975 | A1* | 6/2015 | Sugihara | C04B 35/565 423/346 |
| 2016/0194753 | A1* | 7/2016 | Muto | C23C 16/325 427/249.15 |

OTHER PUBLICATIONS

Fraga, Mariana Amorim, et al., "Recent Developments on Silicon Carbide Thin Films for Piezoresistive Sensors Applications". Silicon Carbide: Materials, Processing and Applications in Electronic Devices, edited by Dr. Moumita Mukherjee. InTech, Oct. 2011, pp. 369-388.*
Horio, Atsushi, et al., "Polytype control by activity ratio of silicon to carbon during SiC solution growth using multicomponent solvents". Japanese Journal of Applied Physics 55, 01AC01 (2016), pp. 1-5.*
Derevyanko, I.V., et al. "Studies of Polytype Silicon Carbide Produced from Recycled Materials". Metallurgical and Mining Industry, 2012, vol. 4, No. 4, pp. 14-18.*
Fan, J., et al., ed., Silicon Carbide Nanostructures, Engineering Materials and Processes, Springer International Publishing, Switzerland 2014, Engineering Materials and Processes. Chapter 2 General Properties of Bulk SiC, 2.1 SiC Polytypes, pp. 7-15.* Nano.*
Attolini et al., "A Comparative Study of the Morphology of 3-SiC Grown at Different C/Si ratios", Materials Science Forum, 153; 615-617 (2009).
Avila et al., "Behavior of oxygen doped SiC thin films: An x-ray photoelectron spectroscopy", J. Appl. Phys. 89(1); 212-216 (2001).
Azevedo et al., "A SiC MEMS Resonant Strain Sensor for Harsh Environment Applications," IEEE Sensors Journal 7(4): 568-876 (2007).
Bogumilowicz et al., "Chemical vapour etching of Si, SiGe and Ge with HCl; applications to the formation of thin relaxed SiGe buffers and to the revelation of threading dislocations," Sci. Technol. 20: 127-134 (2005).
Boo, et al., "Growth of Cubic SiC Films Using 1,3-Disilabutane", Chem. Mater. 7; 694-698 (1995).

Cammarata, "Surface and Interface Stress Effects in Thin Films", Prog. Surf. Sci. 46. 1 (1994).
Chason et al., "Origin of compressive Residual Stress in Polycrystalline Thin Films," Phys. Rev. Lett. 88(15): 156103:1-4 (2002).
Cheng, C., et al., "Atomic relaxation in silicon carbide polytypes", J. Phys.: Condens. Matter 2; 5115-5134 (1990).
Cheung, R., Silicon Carbide Microelectromechanical Systems for Harsh Environments (Imperial College Press, London, 2006).
Dominguez et al., "Low Pressure Chemical Etching of Silicon by HCl/H2 Gas Mixtures", J. Electrochem. Soc. 134(1): 199-201 (1987).
Ferro, "Overview of 3C-SiC Crystaline Growth", Materials Science Forum 645-648, 49-54 (2010).
Fissel, "Artificially layered heteropolytipic structures based on SiC polytypes: molecular beam epitaxy, charcterization and properties", Physics Reports 379; 149-255 (2003).
Fu et al., "Low Stress Polycrystalline SiC Thin Films Suitable of MEMS Applications", J. Electrochem. Soc. 158(6); H675-H680 (2011).
Fu et al., "Use of deposition pressure to control residual stress in polycrystalline SiC films", Appl. Phys. Lett. 84(3); 341-343 (2004).
Fu et al., "Polycrystalline 3C-SiC thin films deposited by dual precursor LPCVD for MEMS applications", Sensors and Actuators A 119; 169-176 (2005).
Fissel, "Artificially layered heteropolytipic structures based on SiC polytypes: molecular beam epitaxy, characterization and properties", Physics Reports 379; 149-255(2003).
Gao and Edgar, "Thermodynamic Analysis of Blanket and Selective Epitaxy of SiC on Si and SiO 2 Masked Si", Mat. Res. Soc. Symp. Proc. 441, 735 (1997).
Gomes, de Mesquita, "Refinement of the Crystal Structure of SiC Type 6H", Acta. Cryst. 23, 610 (1967).
Habermehl, et al., "Formation of stress-controlled, highly textured, x-SIC thin films at 950o C", J. Appl. Phys. 112,013535 (2012).
Habermehl, "Stress relaxation in Si-rich silicon nitride thin films", J. Appl. Phys. 83, 4672 (1998).
Heine et al., "A computational study into the origin of SiC polytypes", Materials Science and Engineering B11, 55 (1992).
Henry A., et al., "Single Crystal and Polycrystalline 3C-SiC for MEMS Applications", Materials Science Forum 615-617, 625 (2009).
Isheden et al., "Selective Si Etching Using HCl Vapor", Physica Scripta T114, 107 (2004).
Ishida et al., "Effect of Reduced Pressure on 3C-SiC Heteroepitaxial Grown on Si by CVD", Chem. Vap. Deposition 12, 495 (2006).
Jeong et al., :Low Tempeaure 4H-SiC Epitaxial Growth on 4H-Sic (1120) and (1100) Faces by Organmetallic Chemical Vapor Deposition, Journal of the Electrochemical Society vol. 149, No. 9 (2002) pp. G526-G531.
Knippenberg, "Growth Phenomena in Silicon Carbide", Philips Res. Reports 18 161 (1963).
Kusumori et al., "Control of polytype formation in silicon carbide heteroepitaxial films by pulsed-laser deposition", Appl. Phys. Lett. 84(8), 1272 (2004).
Lambrecht, W.R.L. et al., "Electronics band Structure of SiC Polytypes: A Discussion of Theory and Experiment", Phys. Stat. Sol. (b) 202, 5 (1997) pp. 5-30.
Lebedev and Davydov, "A Vacancy Model of the Heteropolytype Epitaxy of SiC", Semiconductors 39, 277 (2005).
Lebedev, "Heterojunctions and superlattices based on silicon carbide", Semicond, Sci. Technol. 21. R17 (2006).
Lien et al., Tunable in situ growth of porous cubic silicon carbide thin films via methyltrichlorosilane-based chemical vapor deposition, Appl. Phys. Lett. 95, 101901 (2009).
Limpijumnong and Lambrecht, Total energy differences between SiC polytypes revisted, Phys. Rev. B 57(19), 57 (1998).
Liu et al., "Residual stress characterization of polycrystalline 3C-SiC films on Si(100) deposited from methylsilane", J. Appl. Phys. 106, 013505 (2009).
Locke et al., High Quality Single Cyrstal 3C-Sic(111) Films Grown on Si(111), Materials Science Forum 615-617, 145 (2009).

(56) References Cited

OTHER PUBLICATIONS

Madapura et al., Heteropitaxial Growth of SiC on Si(100) and (111) by Chemical Vapor Deposition Using Trimethylsilane, J. Electrochem. Soc. 146(3), 1197 (199).

Manion, "Evaluated Enthalpies of Formation of the Stable Closed Shell C1 and C2 Chlorinated Hydrocarbons", J. Phys. Chem. Ref. Data 31(1), 123 (2002).

Noh, et al., "Deposition and properties of polycrystalline β-SiC films using LPCVD with different dopant amount", Electronics Lett. 42(13), 775 (2006).

Pazik et al., Chemical vapor deposition of βSiC on silicon-on-sapphire and silicon-on insultator substrates, Materials Science and Engineering B11, 125 (1992).

PDF4+ 2011 database, Moissanite-6H SiC, entry # 04-012-5685, International Centre for Diffraction Data, Newtown Square, PA, see also: McIntyre G.J., Melesi L., Guthrie M., Tulk C.A. Xu J. Parise J.B. J. Phys.: Condens. Matter, 17, S3017,S3024 (2005).

Reyes et al., "Development of a high-growth rate 3C-SiC on Si CVD process", Mater. Res. Soc. Symp. Proc. 911, (2006).

Roper, et al., "Characterization of polycrystalline 3C-SiC films deposited from the precursors 1,3-disilabutane and dischlorosilane", J. Appl. Phys. 103 084907. (2008).

Roper, et al., "Electrical and Mechanical Characterization of Doped and Annealed Polycrystalline 3C-SiC Thin Films", J. Electrochem. Soc. 156, D5 (2009).

Roper et al., "Room-Temperature Wet Etching of Polycrystalline and Nanocrystalline Silicon Carbide Thin Films with HF anf $HNO_3$", J. Electrochem. Soc. 156(3), D104 (2009).

Roper et al., "Stress control of polycrystalline 3C-SiC films in a large-scale LPCVD reactor using 1,3-disilabutane and dischlorosilane as precursors", J. Micromechanics and Microengineering 16, 2736 (2006).

Saito et al., "Low-temperature, low pressure and ultrahigh-rate growth of single-crystalline 3C-SiC on Si substrated by ULP_CVD using organosilane,", Materials Science Forum 645-648, 147 (2010).

Sarro, "Silicon carbide as a new MEMS technology", Sensors and Acutators 82, 210 (2000).

Severino et al., "Towards Large Area (111)3C-SiC Films Grown on off-oriented (111)Si", Materials Science Forum 615-617, 149 (2009).

Spaepen, "Interfaces and Stresses in Thin Films", Acta. Mater. 48, 31 (2000).

Teker, "Selective epitaxial growth of 3C-SiC on patterned Si using hexamethildisilane by APCVD", J. Crystal Growth 257, 245 (2003).

Veneroni and Masi, "Gas-Phase and Surface Kinectics of Epitaxial Silicon Carbide Growth Involving Chlorine-Containing Species", Chem. Vap. Deposition 12, 562 (20060.

Wang and Ma, "Kinetics of halide chemical vapo deposition of silicon carbide film," J. Crystal Growth, 308, 189 (2007).

Zheng et al., "Controlled-growth and characterization of 3C-SiC and 6H-SiC films on C-plane sapphire substrates by LPCVD", J. Alloys and Compounds 426, 290 (2006).

* cited by examiner

METHODS OF DEPOSITING AN ALPHA-SILICON-CARBIDE-CONTAINING FILM AT LOW TEMPERATURE

CROSS-REFERENCE TO RELATED APPLICATIONS

This application is a divisional application of U.S. Ser. No. 13/646,801, filed Oct. 8, 2012 and now abandoned, which is incorporated herein by reference in its entirety.

STATEMENT OF GOVERNMENTAL INTEREST

This invention was developed under Contract DE-AC04-94AL85000 between Sandia Corporation and the U.S. Department of Energy. The U.S. Government has certain rights in this invention.

TECHNICAL FIELD

The present invention is directed generally to methods of forming alpha silicon-carbide (Alpha-SiC), and, more particularly, to methods of depositing Alpha-SiC at a low temperature.

BACKGROUND

Silicon carbide thin films are promising for use in a variety of different electronic, mechanical, chemical, and acoustic applications. Silicon carbide exists in hexagonal, rhombohedral, and cubic crystal structures. Generally, numerous polytypes of the hexagonal and rhombohedral forms are collectively referred to as "Alpha-SiC," while the cubic, zinc blende form of silicon carbide is referred to as "Beta-SiC."

Silicon carbide is considered a superior material for high power, high temperature, and high frequency electronic devices due to its relatively large energy bandgap, high melting point, high saturated electron drift velocity, high breakdown field, high thermal conductivity, and high chemical resistance. Silicon carbide's relatively large energy bandgap also makes this material an excellent choice for fabrication of blue light-emitting diodes and electronic devices for use in radiation intensive environments.

Silicon carbide is also a promising candidate for other applications due to its superior chemical and mechanical properties. For example, silicon carbide's strong chemical resistance make it well suited for exposure to harsh chemical environments, such as in chemical sensing applications. As another example, silicon carbide's relatively high acoustic velocity and low material damping also make it promising for acoustic resonator applications.

Despite silicon carbide's exceptional chemical, electronic, mechanical, and acoustic properties, successful fabrication of silicon carbide thin films continues to pose a challenge. Therefore, there is still a need for improved fabrication techniques for manufacturing silicon carbide thin films so that its exceptional electronic, mechanical, chemical, and acoustic characteristics can be exploited.

SUMMARY

Embodiments of the invention relate to methods of depositing a silicon carbide thin film including Alpha-SiC at low temperatures (e.g., below about 1400° C.), and resulting multi-layer structures and devices incorporating such multi-layer structures. In an embodiment, a method of depositing a silicon carbide film includes introducing a chlorinated hydrocarbon gas and a chlorosilicon gas into a reaction chamber, and reacting the chlorinated hydrocarbon gas with the chlorosilicon gas at a temperature of less than about 1400° C. to grow the silicon carbide film. The silicon carbide film so-grown includes Alpha-SiC.

In an embodiment, a multi-layer structure includes a silicon-based substrate, and a silicon carbide film grown on the silicon-based substrate. The silicon carbide film includes Alpha-SiC.

In an embodiment, the multi-layer structure may be integrated in at least one of a semiconductor device, a sensor, or a microelectromechanical system ("MEMS") device.

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical reference numerals refer to identical or similar elements or features in different views or embodiments shown in the drawings.

DETAILED DESCRIPTION

Embodiments of the invention relate to methods of depositing a silicon carbide thin film including Alpha-SiC at low temperatures (e.g., below about 1400° C.), and resulting multi-layer structures and devices incorporating such multi-layer structures. Alpha-SiC-containing thin films that exhibit a wide electronic bandgap are known to assume numerous polytypes. The most technologically important of these polytypes is the hexagonal (6H) close-packed (Alpha-SiC) polytypes with a bandgap of about 2.9 eV to about 3.3 eV. Other polytypes of Alpha-SiC include 2H-SiC and 4H SiC. In addition to having a wide electronic bandgap, Alpha-SiC also exhibits a relatively high melting point, Young's modulus, thermal conductivity, electron saturation velocity, breakdown field, and chemical stability. These attributes combine to make Alpha-SiC a promising candidate for high power, high temperature, and harsh environment electronic and electro-mechanical applications. However, these same attributes can render the Alpha-SiC difficult to fabricate at temperatures below 1400° C. Furthermore, the temperature range for conventional processing of Alpha-SiC exceeds the melting point of elemental silicon, thereby excluding widely available silicon wafers from consideration as a substrate.

Although thin films of Alpha-SiC have been a challenge to produce at temperatures lower than 1400° C., thin films of 3C Beta-SiC exhibiting cubic symmetry have been produced at much lower temperatures, such as about 900° C. However, due to the smaller bandgap and transport properties, the 3C Beta-SiC material is not generally desired for many applications. The distinction in the performance of the 3C Beta-SiC thin films in comparison to the Alpha-SiC-containing thin films lies in the properties conferred to the thin films at least partially due to their respective crystal structures.

Generally, thin film fabrication may proceed by deposition of material upon another surface of the same or another material. Such growth is usually accomplished by techniques, such as chemical vapor deposition ("CVD"). CVD proceeds as a careful building up of a thin film of new single crystal, polycrystalline, or amorphous material upon the existing material. According to various embodiments disclosed herein, thin film fabrication may proceed via low-pressure CVD ("LPCVD") by introducing a chlorinated hydrocarbon gas and a chlorosilicon gas into a reaction chamber, and reacting the chlorinated hydrocarbon gas with the chlorosilicon gas at a temperature of less than about 1400° C. (e.g., less than about 1000° C.) to grow a silicon carbide thin film comprising Alpha-SiC on a substrate.

Figure 1A:
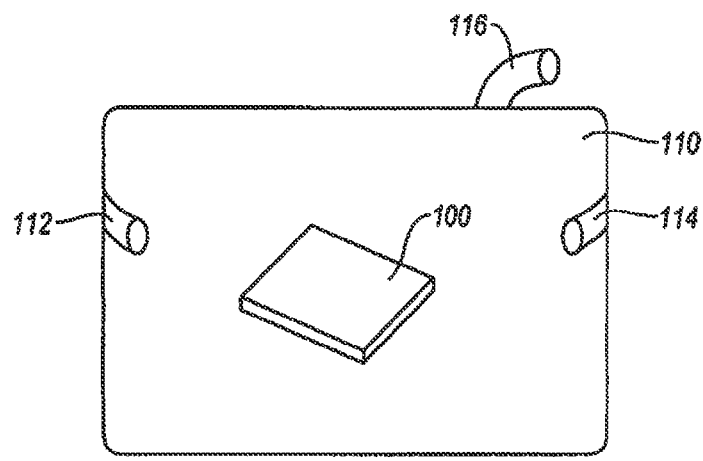
FIGS. 1A-1C are schematic isometric views at different stages during a method of depositing a silicon carbide thin film including Alpha-SiC according to an embodiment.
Figure 1B:
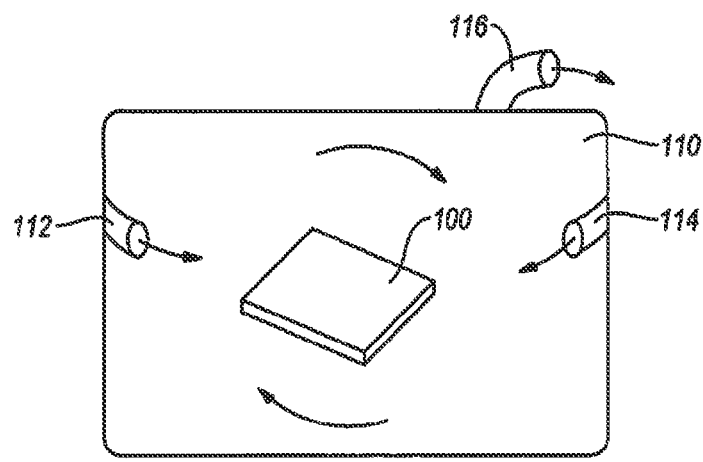
Figure 1C:
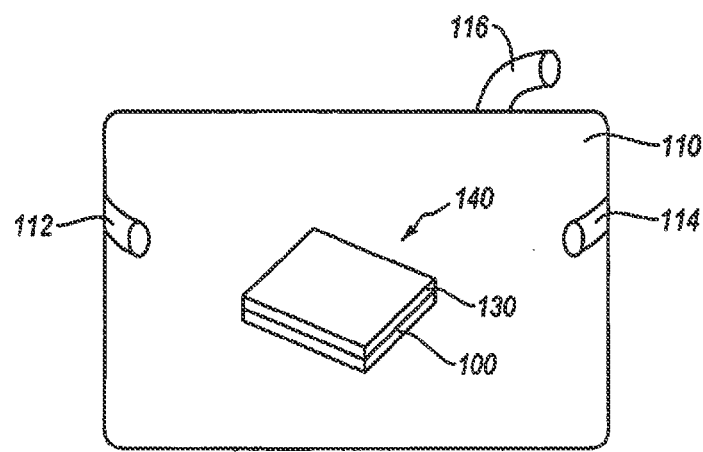

FIGS. 1A-1C are schematic isometric views at different stages during a method of depositing a silicon carbide film including Alpha-SiC according to an embodiment. Referring to FIG. 1A, a substrate 100 is enclosed within a reaction chamber 110 of a CVD apparatus, such as a LPCVD apparatus. Referring to FIG. 1B, a chlorosilicon gas is introduced into the reaction chamber 110 through an access valve 112 and a chlorinated hydrocarbon gas is introduced through an access valve 114 into the reaction chamber 110. The chlorosilicon and chlorinated hydrocarbon gases introduced into the reaction chamber 110 react with each other at or near the substrate 100, thereby resulting in a thin film 130 (see FIG. 1C) being grown on the substrate 100 that comprises Alpha-SiC. For example, the thickness of the thin film 130 may range from greater than about zero to about 7 µm, greater than about zero to about 3 µm, about 1.5 µm to about 4.5 µm, about 3 µm to about 5 µm, greater than about zero to about 1.5 µm, about 250 nm to about 750 nm, about 500 nm to about 950 nm, about 400 nm to about 650 nm, or about 400 nm to about 500 nm.

The chlorosilicon and chlorinated hydrocarbon gases may be chosen from a variety of different suitable gases. In an embodiment, the chlorinated hydrocarbon gas may include trans-1,2-dichloroethylene (DCE, $C_2H_2Cl_2$; also known as dichloroethene) and/or other DCE isomer (e.g., cis-1,2 DCE or 1,1 DCE), trichloroethylene ($C_2HCl_3$; also known as trichloroethene), trichloroethane ($C_2H_3Cl_3$), or combinations of any of the foregoing chlorinated hydrocarbon gases. In an embodiment, the chlorosilicon gas may include dichlorosilane (DCS, $SiH_2Cl_2$), silicon tetrachloride ($SiCl_4$), hexachlorodisilane ($Si_2Cl_6$), trichlorosilane ($HCl_3Si$), or combinations of any of the foregoing chlorosilicon gases. Any combination of the chlorosilicon chlorinated hydrocarbon gases disclosed herein may be used.

Generally, during the CVD process, the substrate 100 (e.g., a silicon-based substrate) is exposed to the chlorosilicon gas and the chlorinated hydrocarbon gas, which react and/or decompose with each other on a surface of the substrate 100 to produce the thin film 130 (see FIG. 1C) resulting in volatile by-products. In an embodiment, these volatile by-products may be removed by gas flow through a gas removal valve 116 of the reaction chamber 110 as shown in FIG. 1B.

The CVD process for growing the thin film 130 including Alpha-SiC may be performed at a range of pressures for the reaction chamber 110. For example, the pressure may be about 25 mTorr to about 300 mTorr, about 100 mTorr to about 300 mTorr, about 50 mTorr to about 200 mTorr, about 100 mTorr to about 200 mTorr, or about 50 mTorr to about 100 MTorr. In some embodiments, LPCVD may be employed, which is similar to CVD, but is carried out at sub-atmospheric pressures. The reduced pressure of LPCVD may reduce undesirable gas-phase reactions and may improve film uniformity across the substrate 100.

The CVD process for growing the thin film 130 including Alpha-SiC may be performed with the substrate 100 maintained at a range of temperatures. For example, the temperature may be less than about 1400° C., less than about 1000° C., greater than about 0° C. to less than about 1000° C., about 500° C. to about 1400° C., about 750° C. to about 1000° C., about 800° C. to about 1400° C., about 800° C. to about 1000° C., about 850° C. to about 975° C., or about 900° C. to about 1000° C. In a more specific embodiment, the LPCVD process for depositing the thin film 130 may be carried out in the reaction chamber 110 with the substrate 100 at a temperature of about 950° C. and the reaction chamber 110 at a pressure of about 75 mTorr.

In an embodiment, when the substrate 100 is a silicon-based substrate such as a silicon wafer, the reaction of the chlorinated hydrocarbon gas with the chlorosilicon gas at a temperature of less than about 1000° C. or less than about 1400° C. to grow the thin film 130 is performed at an HCl pressure sufficient to etch a silicon-based substrate on which the silicon carbide film is directly grown without an intervening Alpha-SiC buffer layer. The inventor currently believes that promoting carbon saturation conditions in the growth zone during the CVD process preferentially induces the formation of the alpha silicon carbide on the silicon-based substrate instead of beta silicon carbide. These carbon saturation conditions are achieved, in part, through HCl selectively etching silicon in the growth zone.

Referring to FIG. 1C, the Alpha-SiC-containing thin films may be used to fabricate a multi-layer structure 140 including the substrate 100 (e.g., a silicon-based substrate) and the thin film 130 grown on the substrate 100 that comprises alpha silicon carbide. In an embodiment, the substrate 100 may be a silicon-based substrate, such as a single crystal silicon wafer (e.g., p- or n-type) or a silicon-on-insulator wafer. For example, the silicon-based substrate used to prepare the Alpha-SiC-containing thin films may include at least one of single crystal silicon, amorphous silicon, a layered silicon-based wafer such as a silicon-on-insulator substrate, silicon carbide, alpha silicon carbide, or beta silicon carbide. In other embodiments, aluminum oxide (e.g., sapphire) may be used as the substrate 100. In an embodiment, when the silicon-based substrate is a silicon wafer, a buffer layer of Alpha-SiC may be provided thereon on which the thin film 130 is grown.

In an embodiment, the thin film 130 may be grown homoepitaxially. Such a method provides for deposition of the thin film 130 on the substrate 100 comprising substantially the same composition and crystal structure such as an Alpha-SiC substrate or an Alpha-SiC buffer layer formed on any suitable substrate. For example, the thin film 130 (as shown in FIG. 1C) may be a single crystal or polycrystalline thin film of Alpha-SiC grown substantially homoepitaxially via LPCVD on the substrate 100 at temperatures below 1000° C., with the substrate 100 also comprising Alpha-SiC.

In another embodiment, the thin film 130 may be grown heteroepitaxially. Such a method provides for deposition of the thin film 130 on the substrate 100 comprising substantially a different composition and crystal structure. For example, the thin film 130 may be a polycrystalline Alpha-SiC thin film exhibiting highly textured, stress-controlled, smooth characteristics grown heteroepitaxially via LPCVD on the substrate 100 at temperatures below 1000° C., with the substrate 100 comprising any material disclosed herein for use as a substrate such as a substrate other than an Alpha-SiC substrate.

X-ray diffraction ("XRD") may be used to identify Alpha-SiC polytypes (e.g., 2H-SiC, 6H-SiC, and 4H-SiC) present within the thin film 130. Integrated intensities of XRD peaks produced in the XRD may be used to provide a polytype ratio parameter, $V_\alpha$. Overlapping XRD peaks make identification of a single XRD peak attributable to substantially a single polytype, such as 6H-SiC, challenging. For example, the 6H(006) peak overlaps the 3C(111) peak, 6H(104) overlaps 3C(200), and 6H(103) overlaps 4H(102). For single crystal or highly-textured specimens, it is therefore not possible to uniquely determine the SiC polytype from the peak position alone. However, one can consider relative peak intensities as another factor for polytype identification. For example, a specimen consisting substantially of 6H-SiC will exhibit a normalized intensity ratio for the 6H(103) to 6H(104) peaks of about 53 to about 23. A parameter $V_\alpha$ is then defined as a ratio of the normalized intensity of the 6H(103) peak to that of the sum of the normalized intensities of the 6H(103) and 6H(104) peaks. Using this relationship for $V_\alpha$ provides a $V_\alpha$ value for a specimen of substantially 6H-SiC alone, of about 0.7. Deviation of $V_\alpha$ from a value of about 0.7 may be an indication that polytypes other than 6H-SiC may be present in the specimen. As a result of the 3C-SiC and 4H-SiC peak overlaps, a $V_\alpha$ value determined to be greater than about 0.7 may indicate that 4H-SiC may be present in the specimen, and a $V_\alpha$ value determined to be less than about 0.7 may indicate that 3C-SiC may be present in the specimen.

In an embodiment, the Alpha-SiC polytype normalized intensity ratio ($V_\alpha$) of the thin film 130 may be controlled by modulating a ratio, $R_T$, of a gas flow rate of the chlorinated hydrocarbon gas to a sum of gas flow rates of the chlorinated hydrocarbon gas and the chlorosilicon gas. For example, in an embodiment, the gas flow rate ratio, $R_T$, may be greater than about 0 to about 1.0, about 0.1 to about 0.8, about 0.4 to about 0.9, about 0.1 to about 0.3, about 0.2 to about 0.6, or about 0.3 to about 0.5. With respect to the aforementioned $R_T$ values, in some embodiments, the thin film 130 may include an atomic ratio of silicon to carbide of substantially 1:1.

As discussed above, the thin film 130 may include a mixture of SiC phases therein. For example, the Alpha-SiC of the thin film 130 may comprise 6H-SiC and at least one of 4H-SiC, 2H-SiC, or beta silicon carbide in various proportions depending on the ratio, $R_T$, of the gas flow rate of the chlorinated hydrocarbon gas to a sum of the gas flow rates of the chlorinated hydrocarbon gas and the chlorosilicon gas.

As mentioned above, the Alpha-SiC polytype normalized intensity ratio, $V_\alpha$, is indicative of different proportions of SiC polytypes (e.g., 2H-SiC, 3C-SiC, 6H-SiC, and 4H-SiC). For example, when the thin film 130 contains a significant portion of 6H Alpha-SiC, the polytype normalized intensity ratio, $V_\alpha$, may be about 0.4 to about 0.9, about 0.5 to about 0.8, or about 0.6 to about 0.9. In another embodiment, when the thin film 130 contains a significant portion of 4H-SiC, the polytype normalized intensity ratio, $V_\alpha$, may be about 0.5 to about 1.0, about 0.7 to about 0.9, or about 0.8 to about 1.0. If the thin film 130 contains a significant portion of 3C-SiC, the polytype normalized intensity ratio, $V_\alpha$, may be greater than zero to about 0.6, greater than zero to about 0.4, or about 0.1 to about 0.3. In another embodiment, the Alpha-SiC-containing thin films may include Beta-SiC interspersed with the Alpha-SiC, with the value of $V_\alpha$ ranging from greater than about zero to about 1.0, about 0.2 to about 0.8, about 0.4 to about 0.9, and about 0.5 to about 0.8.

Similar to the Alpha-SiC polytype normalized intensity ratio ($V_\alpha$), an in-plane residual film stress of the thin film 130, $\sigma_R$, may also be controlled by controlling the $R_T$. The in-plane residual film stress, $\sigma_R$, of the thin film 130 may be measured using, for example, a "wafer curvature method." For example, in an embodiment using a relatively thin substrate 100, the in-plane residual stresses in the thin film 130 may cause the substrate 100 to bend. The induced curvature for the multi-layer structure 140 (as shown in FIG. 1C) depends on the force applied, the elastic properties, as well as the thickness for both the silicon-based substrate 100 and the thin film 130.

In an embodiment, the in-plane residual film stress, $\sigma_R$, of the thin film 130 may vary substantially monotonically from about 200 MPa to about −350 MPa as a function an increasing value of $R_T$. For example, the thin film 130 may exhibit an in-plane residual film stress, $\sigma_R$, which varies from about 150 MPa to about −375 MPa as a function of the increasing ratio of the flow rates of the chlorinated hydrocarbon gas to a sum of the flow rates of the chlorinated hydrocarbon gas and the chlorosilicon gas, $R_T$. In an embodiment, the thin film 130 may exhibit an in-plane residual film stress, $\sigma_R$, which varies from about 100 MPa to about −400 MPa, from about 250 MPa to about −500 MPa, from about 200 MPa to about −200 MPa, or from about 50 MPa to about −100 MPa. Relatively low in-plane residual film stress, $\sigma_R$, may be beneficial in MEMS applications (e.g., membranes and beams) in which relatively higher in-plane residual film stress, $\sigma_R$, may causes undesirable buckling.

The thin film 130 may exhibit high acoustic velocities appropriate for applications in certain MEMS devices (see FIGS. 2A and 3A) such as acoustic resonators (FIG. 2A), sensors (FIG. 2A), actuators, springs, and many other devices. In an embodiment, the multi-layer structure 140 (FIG. 1C) may also be used in an electronic device (see FIGS. 2A and 3A), a sensor, or semiconductor device such as a light emitting diode. As mentioned, silicon carbide's relatively high acoustic velocity and low material damping make it an excellent material for fabrication of acoustic resonator applications for sensitive and selective liquid-phase microsensors. SAW devices are also used as electronic resonators, delay lines, and filters in communication systems. Although widely used in the telecommunications industry, such acoustic devices have many promising features for applications in medicine (biosensors), automotive, and industry (gas, vapor, and humidity sensors).

One of the most routinely used sensing mechanisms that acoustic wave sensors employ is mass loading. Widely used applications of mass loading include film thickness monitoring, gas phase chemical sensing, liquid phase chemical sensing, and biosensing. Given that acoustic energy is confined near a thin surface region of a substrate, SAWs are highly sensitive to surface perturbation of the propagating medium, allowing the SAW device to operate as a viscosity or mass sensor. For sensing applications within a liquid environment, acoustic waves that have the particle displacement substantially parallel to the SAW device surface and substantially normal to the wave propagation direction are preferred. These waves, referred to as shear horizontal (SH) waves, may propagate without significant damping.

Figure 2A:
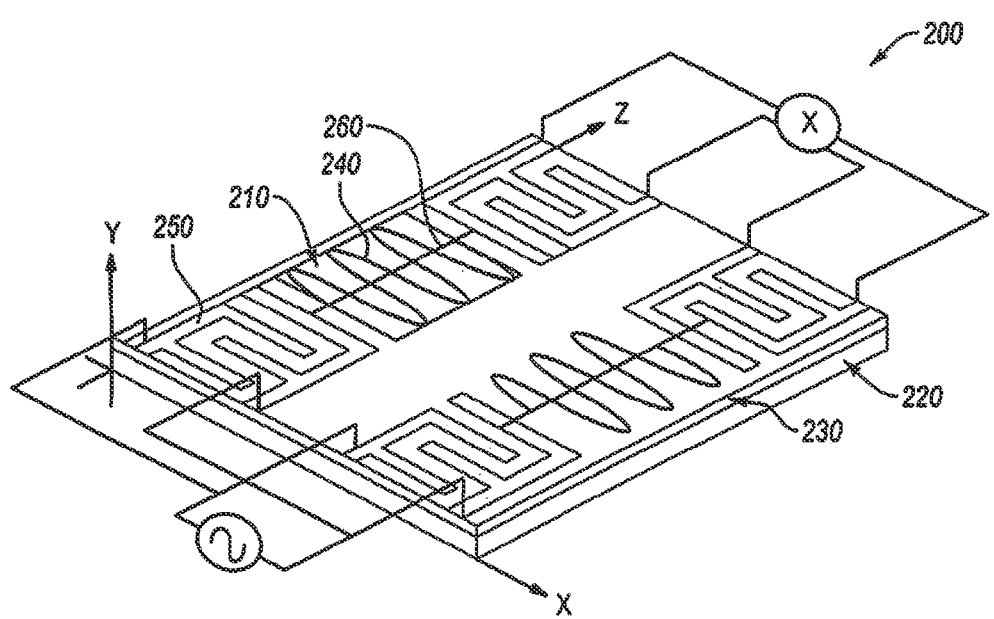
FIG. 2A is a schematic isometric view of a shear horizontal surface acoustic wave ("SH-SAW") microsensor including a multi-layer silicon carbide structure according to an embodiment.

FIG. 2A is a schematic isometric view of an embodiment of a SH-SAW microsensor 200 fabricated using the multi-layer structures including Alpha-SiC-containing thin films described herein. The SH-SAW device 200 includes a multi-layer structure having a substrate 220 (e.g., a silicon-based substrate) coated with an Alpha-SiC-containing thin film 230 and embedded electronics. Delay lines (not shown) of the SH-SAW device 200 may be coated with a biochemical coating 210 that selectively reacts with an analyte (not shown) under analysis. An interaction between the biochemical coating 210 and the analyte may modulate the produced acoustic wave 240 due to the mass loading of the biochemical interaction. The acoustic wave 240 is detected by electroacoustic transducers 250 and a measurement for the physical characteristics (e.g., frequency) is determined from the acoustic wave 240 propagation behavior along a propagation path 260.

Figure 2B:
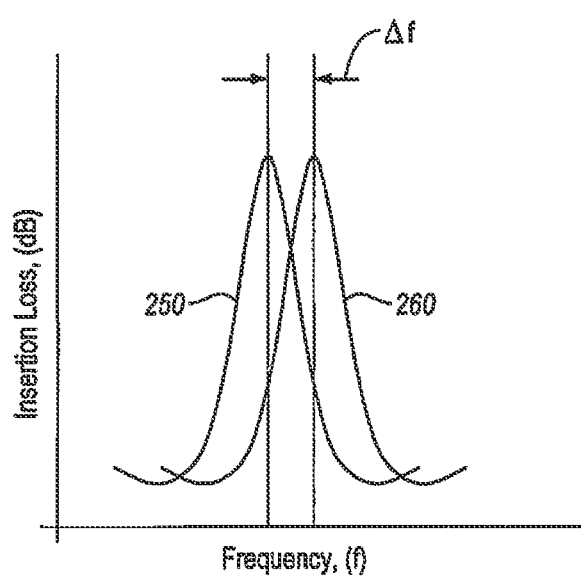
FIG. 2B is a graph that demonstrates a shift in an acoustical frequency domain during mass loading of the SH-SAW microsensor shown in FIG. 2A.

As shown in FIG. 2B, such an acoustic modulation may produce a shift in the acoustic resonant frequency, $\Delta f$ of the SH-SAW device 200. FIG. 2B illustrates an acoustic frequency of a reference device 250, and that of an acoustic frequency of an analyte loaded device 260. A shift in the frequency domain, $\Delta f$ is due to a mass loading of the analyte interaction with the biochemical coating 210. A measurement of this shift in frequency domain, $\Delta f$, may provide a detailed analysis of the analyte. The micron-scale dimensions of these SH-SAW devices including the Alpha-SiC thin film multi-layer structures provide an increased surface area to mass ratio that provides for higher sensitivity than other conventional methods. Moreover, such devices may provide label free, robust detection of the analyte of interest.

Figure 3A:
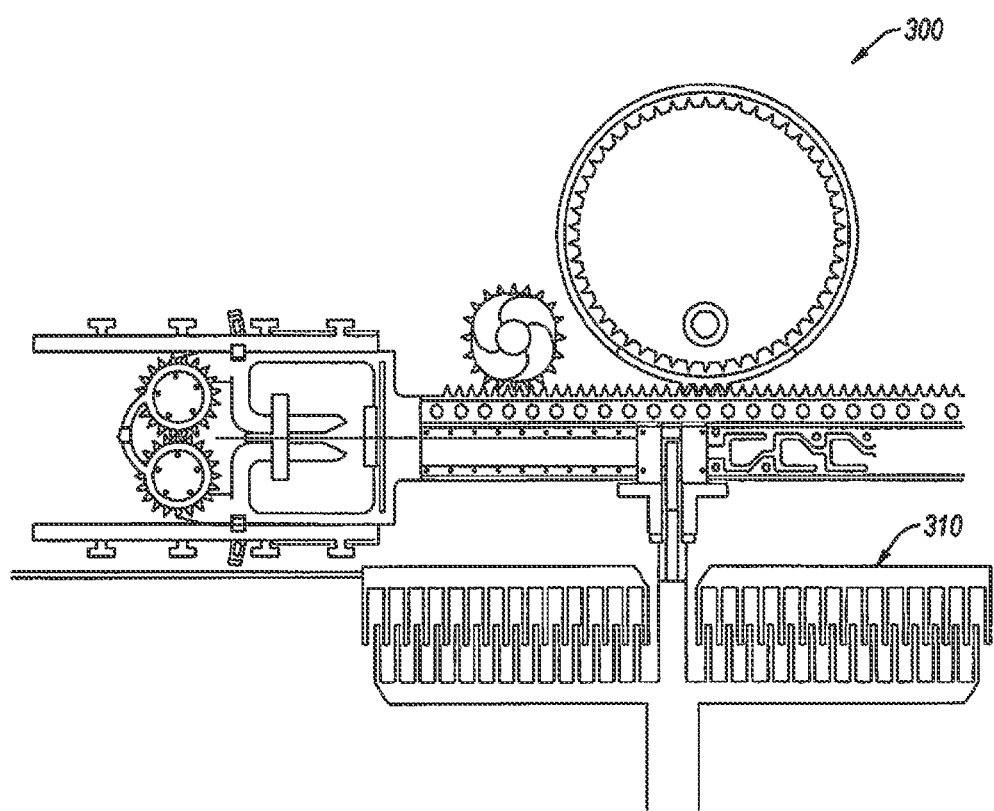
FIG. 3A is a plan view of a MEMS electromechanical lock including a multi-layer silicon carbide structure according to an embodiment.

FIG. 3A is a schematic isometric view of a MEMS electromechanical lock 300 fabricated using a multi-layer structure (similar to the multi-layer structure 140 shown FIG. 1C) including any of the Alpha-SiC-containing thin films disclosed herein. In an embodiment, fabrication of substantially all of the MEMS electromechanical lock 300 is by deposition of the Alpha-SiC-containing thin films onto various substrates using any of the methods described herein to form the elements and components of the MEMS electromechanical lock 300. The substrate (not shown) used to form part of the MEMS electromechanical lock 300 may also contain the electronics for interacting and actuating the MEMS electromechanical lock 300. For example, the micron-scale Alpha-SiC components of the MEMS electromechanical lock 300 may be actuated electrostatically. In an embodiment, the position of the components of the MEMS electromechanical lock 300 may also be sensed capacitively. Hence, the MEMS electromechanical lock 300 may include electronics, such as electrostatic drive power supplies, capacitance charge comparators, and signal conditioning circuitry suitable for actuating and sensing as known in the art. Integration of the MEMS electromechanical lock 300 into larger package may be achieved via wire bonding and encapsulation into integrated circuitry packages or other suitable microelectronic processing technique.

Figure 3B:
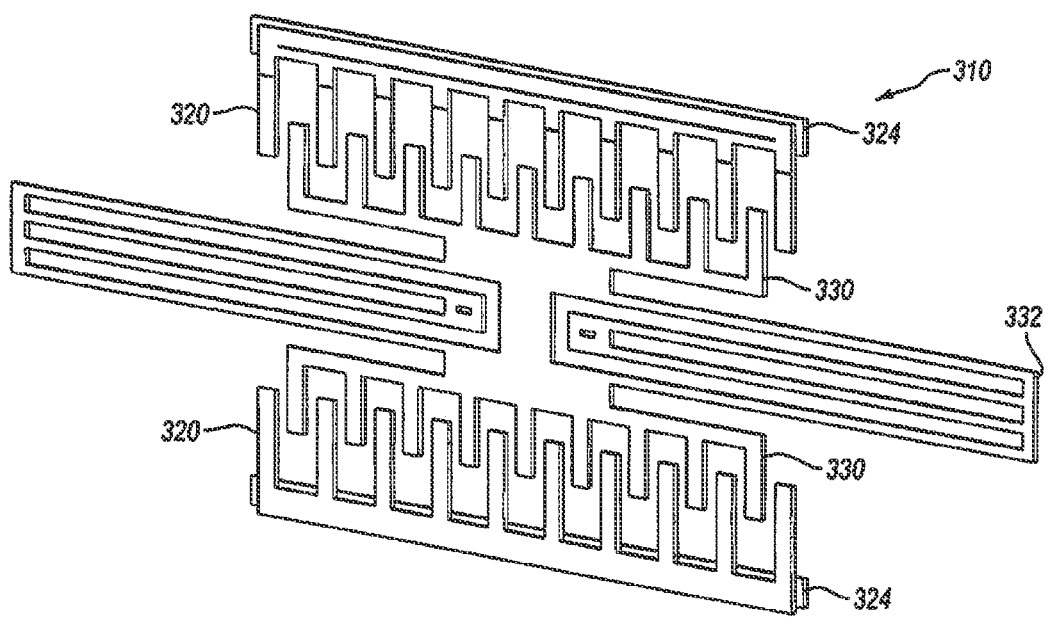
FIG. 3B is an isometric view of a linear comb drive, similar to that found in the MEMS electromechanical lock shown in FIG. 3A.

FIG. 3B illustrates a MEMS actuator known as a linear comb drive 310 of the MEMS electromechanical lock 300 shown in FIG. 3A. Substantially the entire linear comb drive 310 is fabricated using the multi-layer structures including Alpha-SiC-containing thin films described herein. The multi-layer structures forming the linear comb drive 310 may include or have embedded the electronics for actuating the linear comb drive 310. The linear comb drive 310 comprises rows of interlocking teeth 320 and 330. According to the illustrated embodiment, half of the interlocking teeth 320 are attached to a fixed beam 324, the other half of the interlocking teeth 330 are attached to a movable beam assembly 332. Both assemblies of interlocking teeth 320 and 330 are electrically insulated. By applying the same polarity voltage to both sets of interlocking teeth 320 and 330, the resultant electrostatic force repels the movable beam teeth 330 away from the fixed beam teeth 320. Conversely, by applying opposite polarity the interlocking teeth 320 and 330 are attracted. It is this mechanical drive that actuates the comb to be moved "in" or "out" and either DC or AC voltages may be applied. The low inertial mass of the Alpha-SiC thin film coated silicon-based substrate micron-sized parts results in a drive that has a very fast response time compared to a conventional electromechanical lock.

Single crystal Alpha-SiC-containing thin films grown homoepitaxially may provide substrates with low defect densities appropriate for use in electronic applications such as in photovoltaic power inverters, FET applications, LEDs (light emitting diodes), and high power electric utility grid switching applications. High power systems based on silicon technology require very expensive cooling technology to maintain performance. SiC power systems can operate at temperatures above 250° C., thereby obviating the need for external cooling and the associated cost.

Figure 4:
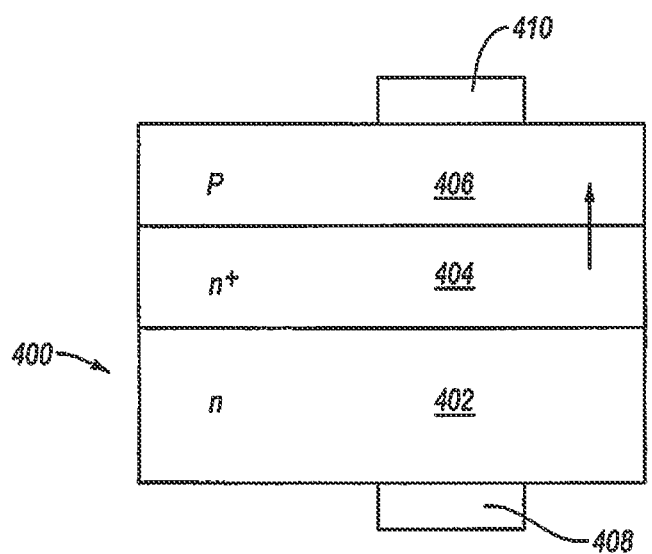
FIG. 4 is a schematic cross-sectional view of a light emitting diode ("LED") fabricated using single crystal Alpha-SiC-containing thin film according to an embodiment.

FIG. 4 is a schematic cross-sectional view of an embodiment of a LED 400 fabricated using single crystal Alpha-SiC-containing thin films formed according to any of the embodiments disclosed herein. The LED 400 includes a substrate 402. For example, the substrate 402 may comprise single crystal alpha silicon carbide substrate having, for example, n– type doping or any other substrate disclosed herein. An n+ type epitaxial layer 404 of Alpha-SiC may be grown homoepitaxially on the substrate 402. A p-type epitaxial layer 406 of Alpha-SiC may be grown homoepitaxially on the n+ type epitaxial layer 404. Ohmic contacts 408 and 410 are provided, which are in electrical contact with the substrate 402 and the p-type epitaxial layer 406 for biasing the LED 400 so that blue light having a wavelength in a range of about 455 nm to about 460 nm is emitted. For example, the ohmic contacts 408 and 410 may be made from nickel or other suitable material.

It should be noted that the devices illustrated in FIGS. 2A-4 are merely three applications for the multi-layer structures including Alpha-SiC-containing thin films. Various other applications for the multi-layer structures including Alpha-SiC-containing thin films may be employed, such as radiation sensors or semiconductor light emitting devices. In such applications, the thin film containing Alpha-SiC may be fabricated as a single crystal so that it has a relatively low defect density. Other semiconductor device applications include power SiC transistors, thyristors, Schottky diodes, MOSFETs, among others.

Working Examples

The following working examples for fabricating thin films including Alpha-SiC provide further detail in connection with the specific embodiments described above.

Six SiC thin films were deposited by LPCVD on 150 mm p-type Si(100) wafers with a resistivity range of 2-20 ohm-cm. The chlorosilicon gas used was DCS and carbon was supplied by a DCE chlorinated hydrocarbon gas into a reaction chamber similar to that shown in FIGS. 1A-1C. For all six films, the thin film deposition was carried out with the substrate at a temperature of about 950° C. and the LPCVD reaction chamber at pressure of about 75 mTorr. To avoid HCl etch damage to the Si(100) surface, a 20 nm SiC protective buffer layer was initially deposited onto the substrate at 850° C. with a gas ratio, $R_T$, of 0.44. The polytype ratio, $V_\alpha$, and residual film stress, $\sigma_R$, of the fabricated thin films were controlled by varying the DCE and DCS gas flow, or the gas ratio, $R_T$, which is the ratio of the DCE flow to the total (DCE+DCS) flow. The film deposition rate, $R_d$, was found to be inversely proportional to the gas ratio, $R_T$. The film deposition rate, $R_d$, ranged from about 2 nm/min to about 4 nm/min depending on the specific working example. Fabrication criteria for the thin films, as well as parameters determined by analysis following film fabrication, are listed in the following Table I.

TABLE I

| $R_T$ | $R_d$ (nm/min) | d (nm) | $\sigma_R$ (MPa) | $\alpha$ (×10$^{-6}$ K$^{-1}$) | $\sigma_{th}$ (MPa) | $\sigma_I$ (MPa) | $V_\alpha$ |
|---|---|---|---|---|---|---|---|
| 0.3 | 3.4 | 592 | 205 | 4.60 | 182 | 23.0 | 0.62 |
| 0.354 | 3.25 | 1140 | 35 | 4.63 | 186 | −151 | 0.677 |
| 0.375 | 3 | 522 | −101 | 4.63 | 187 | −288 | 0.688 |
| 0.401 | 2.8 | 428 | −166 | 4.68 | 195 | −361 | 0.79 |
| 0.444 | 2.75 | 440 | −320 | 4.67 | 193 | −513 | 0.77 |
| 0.464 | 2.3 | 628 | −356 | 4.65 | 191 | −547 | 0.74 |

Parameters listed in Table I include gas flow ratio values ($R_T$), film deposition rates ($R_d$), and the thickness of the thin film deposited (d). For example, in the working example of the top row, a SiC thin film was deposited using a gas flow ratio value, $R_T$, of 0.3, with a rate of deposition of 3.4 nm/min, with a thickness of 592 nm. Other parameters listed in Table I include data determined from analysis of the fabricated thin films and include the thin film residual stress ($\sigma_R$), the film coefficient of thermal expansion ($\alpha$), the film thermal expansion mismatch stress ($\sigma_{th}$), the film intrinsic stress ($\sigma_i$), and the film polytype ratio ($V^\alpha$). For example, in the same working example on the top row, the fabricated thin film was determined to have a residual film stress, $\sigma_R$, of 205 MPa, a film coefficient of thermal expansion, $\alpha$, of 4.60×10$^{-6}$ K$^{-1}$, a film thermal expansion mismatch stress, $\sigma_{th}$, of 182 MPa, a film intrinsic stress, $\sigma_i$ of 23.0 MPa, and the film polytype ratio, $V_\alpha$, of 0.62.

The in-plane residual film stress, $\sigma_R$, of the thin films was measured by the wafer curvature method as described herein. The intrinsic stress, $\sigma_i$, of the thin films was determined by subtracting the thermal expansion mismatch stress ($\sigma_{th}=\Delta\alpha\Delta T$) from the residual stress, $\sigma_i=\sigma_R-\Delta\alpha\Delta T$, where $\Delta\alpha$ is the difference in the coefficient of thermal expansion between the film and substrate. Because of slight differences in thermal expansion between Alpha-SiC and Beta-SiC, $\alpha$ for the film was determined from a weighted average of the two polytypes assuming isostrain conditions.

XRD was performed on the deposited thin films using a Scintag PAD X diffractometer employing a sealed-tube Cu X-ray source having a 1 mm pinhole incident-beam optic. The $\theta$-$2\theta$ style goniometer was equipped with a texture-cradle (−15 to +90° $\chi$, 0 to 360° $\phi$) for pole-figure measurement (where $\chi$ is the tilt angle from surface normal and $\phi$ is the spindle axis). The diffractometer was equipped with a Ge solid-state point-detector. Pole figure data sets were collected using 5° steps ($\chi$ range 0-80°, $\phi$=0-355°). Defocusing corrections and intensity vs. $\chi$-angle (Iv$\chi$) plots were made using an in-house Matlab program. Iv$\chi$plots were derived by taking the corrected pole figure data and integrating the $\phi$ intensities at a given $\chi$ angle to generate a one dimensional plot of measured intensity for a given $\chi$ angle. Pole figure plots were generated using the program Stereopole (ver.1.0).

Analysis of the XRD data confirmed the presence of Alpha-SiC in the deposited thin films. In the case of 6H Alpha-SiC, the 6H(103) and 6H(104) peaks have expected relative intensities of 53% and 23%, respectively, based on normalized scaling. Given this fact, an assessment of the ratio of $\alpha$-SiC to $\beta$-SiC was established. By comparing the integrated intensities of Iv$\chi$ plots obtained from the 6H(103) and 6H(104) pole figures, the parameter $V_\alpha$ was derived. A mathematical model of $V_\alpha$ was determined by the quotient of the integrated intensity of the 6H(103) to the sum of the 6H(103) and 6H(104) integrated intensities. The polytype ratio (ratio of Alpha-SiC to Beta-SiC) parameter, $V_\alpha$, was derived using the following formula (1):

$$V_\alpha = \frac{[I_{6H(103)} + I_{4H(102)}]}{[I_{6H(103)} + I_{4H(102)}] + [I_{6H(104)} + I_{3C(200)}]}$$

where $I_n$ is the integrated intensity of the peak for a given polytype and crystal plane (n), and peaks subject to potential superposition are grouped together in brackets.

For the case of substantially pure 6H, (6H(103) and 6H(104) peaks), the derived model determined a $V_\alpha$ value of about [53/(53+23)]=0.70 as determined from the relative intensities of 53% to 23%, respectively, based on a normalized scaling. If the thin film contained a significant portion of $\beta$-SiC, then the 3C(200) intensity would superimpose upon the 6H(104) and increase the overall weighting of the Iv$\chi$ plot, thus reducing the value to below about 0.70. If the value is in excess of 0.7, it suggests that some 4H SiC is present because the 4H(102) is in an identical $2\theta$ location and x tilt to that of the 6H(103), but the 4H polytype does not have a corresponding reflection at 41.4° $2\theta$ where the 6H(104) and 3C(200) peaks are found. A fully cubic 3C film would have a $V_\alpha$ of about zero. A fully hexagonal 4H film would have $V_\alpha$ of about 1.0.

The results in Table I show that in all of the thin films fabricated and analyzed within the working examples, a $V_\alpha$ value of greater that 0.6 and less than 0.8 was obtained. This result is consistent with an abundance of 6H and 4H Alpha-SiC polytypes present within the thin films fabricated in all six working examples.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method of depositing a silicon carbide film, the method comprising:
   introducing a chlorinated hydrocarbon gas and a chlorosilicon gas into a reaction chamber; and
   reacting the chlorinated hydrocarbon gas with the chlorosilicon gas at a temperature of less than about 1400° C. to grow the silicon carbide film on a silicon-based substrate, wherein the silicon carbide film as grown on the silicon-based substrate comprises alpha silicon carbide and has a polytype ratio $V_\alpha$ of at least 0.6 and not more than 0.8.

2. The method of claim 1, wherein the chlorinated hydrocarbon gas comprises at least one chlorinated hydrocarbon gas member selected from the group consisting of dichloroethylene, trichloroethane, and trichloroethylene.

3. The method of claim 1 wherein the chlorosilicon gas comprises at least one chlorosilicon gas member selected from the group consisting of dichlorosilane, silicon tetrachloride, hexachlorodisilane, and trichlorosilane.

4. The method of claim 1, further comprising controlling a ratio of a flow rate of the chlorinated hydrocarbon gas to a sum of a flow rate of the chlorinated hydrocarbon gas and the chlorosilicon gas to alter a film stress of the silicon carbide film.

5. The method of claim 1 wherein the silicon carbide film exhibits a residual film stress that varies from about 150 MPa to about −375 MPa.

6. The method of claim 1 wherein introducing a chlorinated hydrocarbon gas and a chlorosilicon gas into a reaction chamber comprises flowing the chlorinated hydrocarbon gas and the chlorosilicon gas at respective flow rates such that a ratio of a flow rate of the chlorinated hydrocarbon gas to a sum of a flow rate of the chlorinated hydrocarbon gas and the chlorosilicon gas is about 0.1 to about 0.8.

7. The method of claim 1 wherein introducing a chlorinated hydrocarbon gas and a chlorosilicon gas into a reaction chamber comprises flowing the chlorinated hydrocarbon gas and the chlorosilicon gas at respective flow rates such that a ratio of a flow rate of the chlorinated hydrocarbon gas to a sum of a flow rate of the chlorinated hydrocarbon gas and the chlorosilicon gas is about 0.3 to about 0.5.

8. The method of claim 1, further comprising controlling a hexagonal silicon carbide polytype ratio in the silicon carbide film by controlling a ratio of a flow rate of the chlorinated hydrocarbon gas to a sum of a flow rate of the chlorinated hydrocarbon gas and the chlorosilicon gas.

9. The method of claim 1 wherein the alpha silicon carbide comprises 6H-SiC and at least one member selected from the group consisting of 4H-SiC, 2H-SiC, and beta silicon carbide.

10. The method of claim 1 wherein the silicon carbide film comprises beta SiC interspersed with the alpha silicon carbide.

11. The method of claim 1 wherein reacting the chlorinated hydrocarbon gas with the chlorosilicon gas at a temperature of less than about 1400° C. to grow the silicon carbide film comprises growing the silicon carbide film homoepitaxially or heteroepitaxially.

12. The method of claim 1 wherein the silicon-based substrate includes an Alpha silicon carbide buffer layer thereon on which the silicon carbide film is grown.

13. The method of claim 1 wherein the silicon-based substrate comprises at least one member of the group consisting of a silicon wafer and a silicon-on-insulator wafer.

14. The method of claim 1 wherein the temperature is in a range of about 800° C. to about 1000° C.

15. The method of claim 1 wherein reacting the chlorinated hydrocarbon gas with the chlorosilicon gas at a temperature of less than about 1400° C. to grow the silicon carbide film is performed at an HCl pressure sufficient to etch a silicon-based substrate on which the silicon carbide film is grown, thereby preferentially inducing the growth of the alpha silicon carbide on the silicon-based substrate instead of beta silicon carbide.

16. The method of claim 1 wherein reacting the chlorinated hydrocarbon gas with the chlorosilicon gas at a temperature of less than about 1400° C. to grow the silicon carbide film is performed via low-pressure chemical vapor deposition.

17. The method of claim 1, further comprising doping the silicon carbide film with an n-type dopant.

18. A method of depositing a silicon carbide film, the method comprising:
   flowing a chlorinated hydrocarbon gas and a chlorosilicon gas at respective flow rates into a low-pressure chemical vapor deposition chamber containing a silicon-based substrate maintained at a temperature of less than about 1400° C.;
      wherein a ratio of a flow rate of the chlorinated hydrocarbon gas to a sum of a flow rate of the chlorinated hydrocarbon gas and the chlorosilicon gas is about 0.3 to about 0.5;
      wherein the chlorinated hydrocarbon gas comprises at least one chlorinated hydrocarbon gas member selected from the group consisting of dichloroethylene, trichloroethane, and trichloroethylene;
      wherein the chlorosilicon gas comprises at least one chlorosilicon gas member selected from the group consisting of dichlorosilane, silicon tetrachloride, hexachlorodisilane, and trichlorosilane; and
   reacting the chlorinated hydrocarbon gas and the chlorosilicon gas to grow the silicon carbide film over the silicon-based substrate, wherein the silicon carbide film as grown on the silicon-based substrate comprises alpha silicon carbide and has a polytype ratio $V_\alpha$ of at least 0.6 and not more than 0.8.

* * * * *